(12) United States Patent
Opris

(10) Patent No.: US 8,988,146 B1
(45) Date of Patent: Mar. 24, 2015

(54) VOLTAGE AMPLIFIER FOR CAPACITIVE SENSING DEVICES USING VERY HIGH IMPEDANCE

(71) Applicant: Ion E. Opris, San Jose, CA (US)

(72) Inventor: Ion E. Opris, San Jose, CA (US)

( * ) Notice: Subject to any disclaimer, the term of this patent is extended or adjusted under 35 U.S.C. 154(b) by 90 days.

(21) Appl. No.: 13/986,803

(22) Filed: Jun. 7, 2013

(51) Int. Cl.
  *H03K 17/16* (2006.01)
  *H03F 3/45* (2006.01)
  *H03K 17/687* (2006.01)

(52) U.S. Cl.
  CPC .......... *H03K 17/165* (2013.01); *H03F 3/45076* (2013.01); *H03K 17/6871* (2013.01)
  USPC ............................................. 330/86; 330/307

(58) Field of Classification Search
  CPC ....... H03G 1/0088; H03G 3/001; H03G 7/02; H03G 3/22; H03G 1/007; H03F 3/45475; H03F 1/34; H03F 2203/45534; H03F 3/72; H03F 1/0277; H03F 3/195; H03F 3/26; H03F 3/308; H01L 2924/3011
  USPC .............. 330/51, 86, 144, 282, 307; 333/262, 333/263
  See application file for complete search history.

(56) References Cited

U.S. PATENT DOCUMENTS

| 4,855,685 A * | 8/1989 | Hochschild | 330/282 |
| 6,211,729 B1 * | 4/2001 | Morkner et al. | 330/51 |
| 6,825,717 B2 * | 11/2004 | Dettmann | 330/86 |
| 7,265,616 B2 * | 9/2007 | Tsuruhata et al. | 330/86 |

* cited by examiner

*Primary Examiner* — Khanh V Nguyen

(57) ABSTRACT

According to some embodiments, a switch having an "on" state and an "off" state is exhibiting a low impedance in the "on" state, and a very high impedance in the "off" state. The switch comprises three series MOS transistors, the first transistor having its drain connected to the input. The switch also comprises additional circuitry which reduces, in the "off" state, the leakage current of the MOS transistor connected to the input of the switch by connecting its source and bulk to an electrical node replicating the voltage of the input node. According to some embodiments, the said switch is used in a voltage amplifier for capacitive sensing devices, such as MEMS gyroscopes and MEMS microphones; the voltage amplifier uses an operational amplifier used in a trans-capacitance configuration, with the feedback path comprising the said switch and a capacitor, wherein the said switch is connected to the input of, the voltage amplifier. According to some embodiments, the said switch is used in an integrated circuit which processes the voltage across a sensing device.

5 Claims, 4 Drawing Sheets

US 8,988,146 B1

VOLTAGE AMPLIFIER FOR CAPACITIVE SENSING DEVICES USING VERY HIGH IMPEDANCE

BACKGROUND

This invention relates to a switch used in electronic systems in which the voltage across a capacitor is amplified by a trans-capacitance operational amplifier.

Electronic systems which process the voltage provided by a sensing device approximately modeled by a capacitor (such as a MEMS gyroscope or a MEMS microphone) use a voltage amplifier implemented as a continuous' time trans-capacitance operational amplifier. The operational amplifier feedback path comprises a capacitor in series with a switch. It is desirable that the switch is connected to the input of the operational amplifier (and hence to the sensing device), while the capacitor is connected to the output of the operational amplifier. The sensing device provides a very low voltage, so it is critical that the current leakage due to the imperfections of the switch in the "off" state is minimized. Therefore, the switch used in the sampling circuitry requires a very high impedance (>1 TOhm) in the "off" state, and a low impedance (<1 kOhm) in the "on" state.

Conventional techniques use one or two MOS transistors to implement the switch. These transistors must have a ratio W/L high enough to allow a low impedance in the "on" state. However, the larger this ratio is, the larger the leakage of the switch becomes in the "off" state. Such conventional techniques can only achieve an equivalent "off" impedance on the order of a few GOhms. To avoid the unacceptable leakage from the sensing device, conventional switches are connected at the output of the operational amplifier. This solution has significant disadvantages, such as the increase of the noise of the amplifier due to the switching of the capacitor in parallel to the sensing device.

SUMMARY

Aspects of the invention include a switch comprising one input, one output, a digital control signal, three series MOS transistors (all three being PMOS or all three being NMOS), and additional circuitry which properly biases the drains and sources of the said three MOS transistors not connected to either the said input or to the said output; wherein the digital control signal is in the "on" state then the said drains and sources are left floating; and when the digital control signal is in the "off" state then the said drains and sources are connected to electrical nodes which voltages minimize the leakage current flowing through the said input.

Aspects of the invention include a method to amplify a voltage across a capacitor comprising a switch connected in series with a capacitor and an operational amplifier, such that the switch is connected to the input of the operational amplifier and the capacitor to the output of the operational amplifier; wherein the said switch comprises one input, one output, a digital control signal, three series MOS transistors (all three being PMOS or all three being NMOS), and additional circuitry which properly biases the drains and sources of the said three MOS transistors not connected to either the said input or to the said output; wherein the digital control signal is in the "on" state then the said drains and sources are left floating; and when the digital control signal is in the "off" state then the said drains and sources are connected to electrical nodes which voltages minimize the leakage current flowing through the said input.

BRIEF DESCRIPTION OF THE DRAWINGS

The foregoing aspects and advantages of the present invention will become better understood upon reading the following detailed description and upon reference to the drawings where.

DETAILED DESCRIPTION OF PREFERRED EMBODIMENTS

The following description illustrates the present invention by way of example and not necessarily by way of limitation. Any reference to an element is understood to refer to at least one element. A set of elements is understood to include one or more elements. Any recited connection is understood to encompass a direct operative connection or an indirect operative connection through intermediary structure(s).

Figure 1:
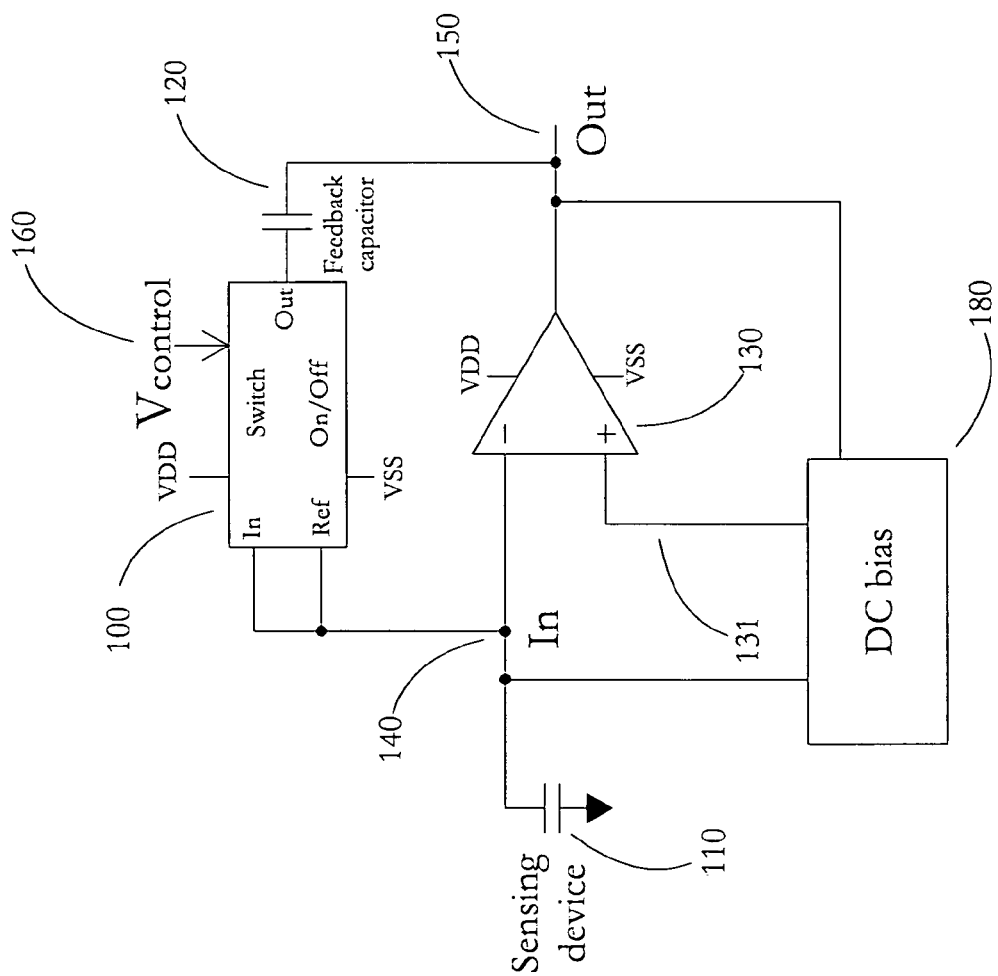
FIG. 1 shows the schematic of a voltage amplifier which amplifies the voltage across a sensing device modeled as a capacitor, and which comprises a switch, according to some embodiments of the present invention.

FIG. 1 shows the schematic of a voltage amplifier which amplifies the voltage across a sensing device 110 modeled as a capacitor, according to some embodiments of the present invention. The control signal 160 sets the amplifier either in the sampling mode (in which mode the switch is "off"), or in the hold mode (in which mode the switch is "on"). The amplifier comprises an operational amplifier 130, a switch 100, and a feedback capacitor 120. The DC bias block 180 sets the DC bias of the said operational amplifier inputs and ensures a stable functioning of the voltage amplifier. At the terminal Ref of the switch 100 we apply a signal which voltage substantially replicates the voltage of the input 140, such as the signal of the input 140 itself. In the sampling mode the impedance of the switch needs to be low (<1 kOhm). In the hold mode the amplifier must provide a very low input leakage current, otherwise the voltage across the sensing device is altered. Sensing devices 110 that can be approximately modeled as a capacitor include, but are not limited to, MEMS gyroscopes or MEMS microphones. In another embodiment, the signal applied at the terminal Ref of the switch is the non-inverting input 131 of the operational amplifier 130.

Figure 2:
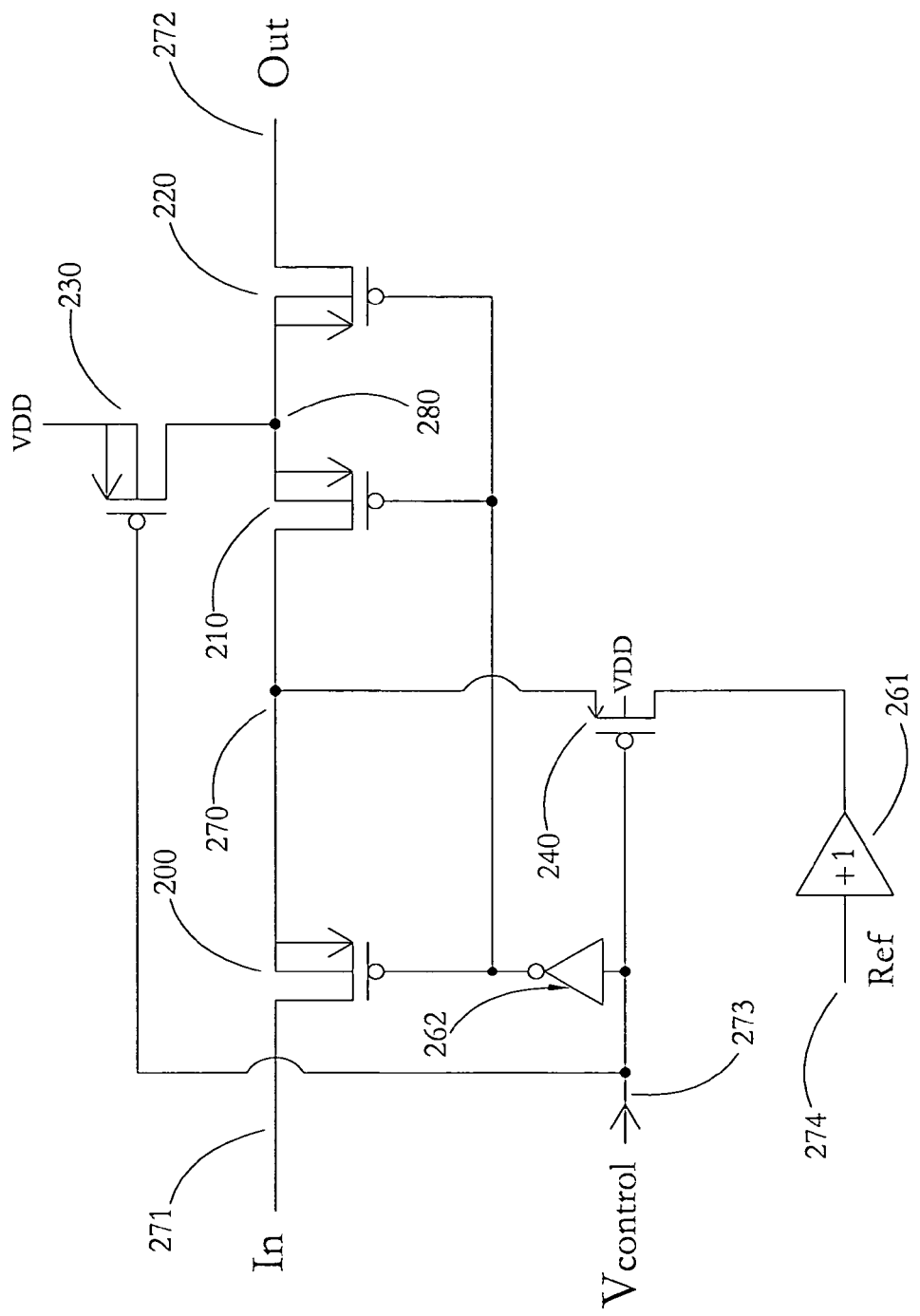
FIG. 2 shows the schematic of a switch using PMOS transistors exhibiting a very high impedance in the "off" state, according to some embodiments of the present invention.

FIG. 2 shows the schematic of a switch having very high impedance in the "off" state, according to some embodiments of the present invention. The switch has an input 271, an output 272, a digital control 273, and another "Ref" input 274 which is connected externally to a signal which voltage is substantially equal to the voltage of the input 271. The switch uses three series PMOS transistors 200, 210, and 220. The drain of 200 is connected to the input 271. The source and the bulk of 200 are connected together to the drain of 210, thus creating the node 270. The source and bulk of 210 are connected together to the source and the bulk of 220, thus creating the node 280. The drain of 220 is connected to the output 272. The control signal sets through the inverter 262 the voltages of the gates of 200, 210, and 220, to either VDD or VSS, thus turning them on or off. In addition, the unity-gain buffer 261 substantially replicates at its output the voltage of the input "Ref" node 274. In addition, in the "on" mode, the control voltage leaves floating, through the devices 230 and 240, the electrical nodes 270 and 280. In addition, in the "off" mode, the control voltage forces, through the device 240, the node 270 to the voltage of the input 274, which is substantially equal to the voltage of the input 271, hence increasing the threshold voltage of the transistor 200 due to its body effect and considerably reducing the leakage current drawn from the input 271. In addition, in the "off" mode, the control voltage forces, through the device 230, the node 280 to VDD.

Figure 3:
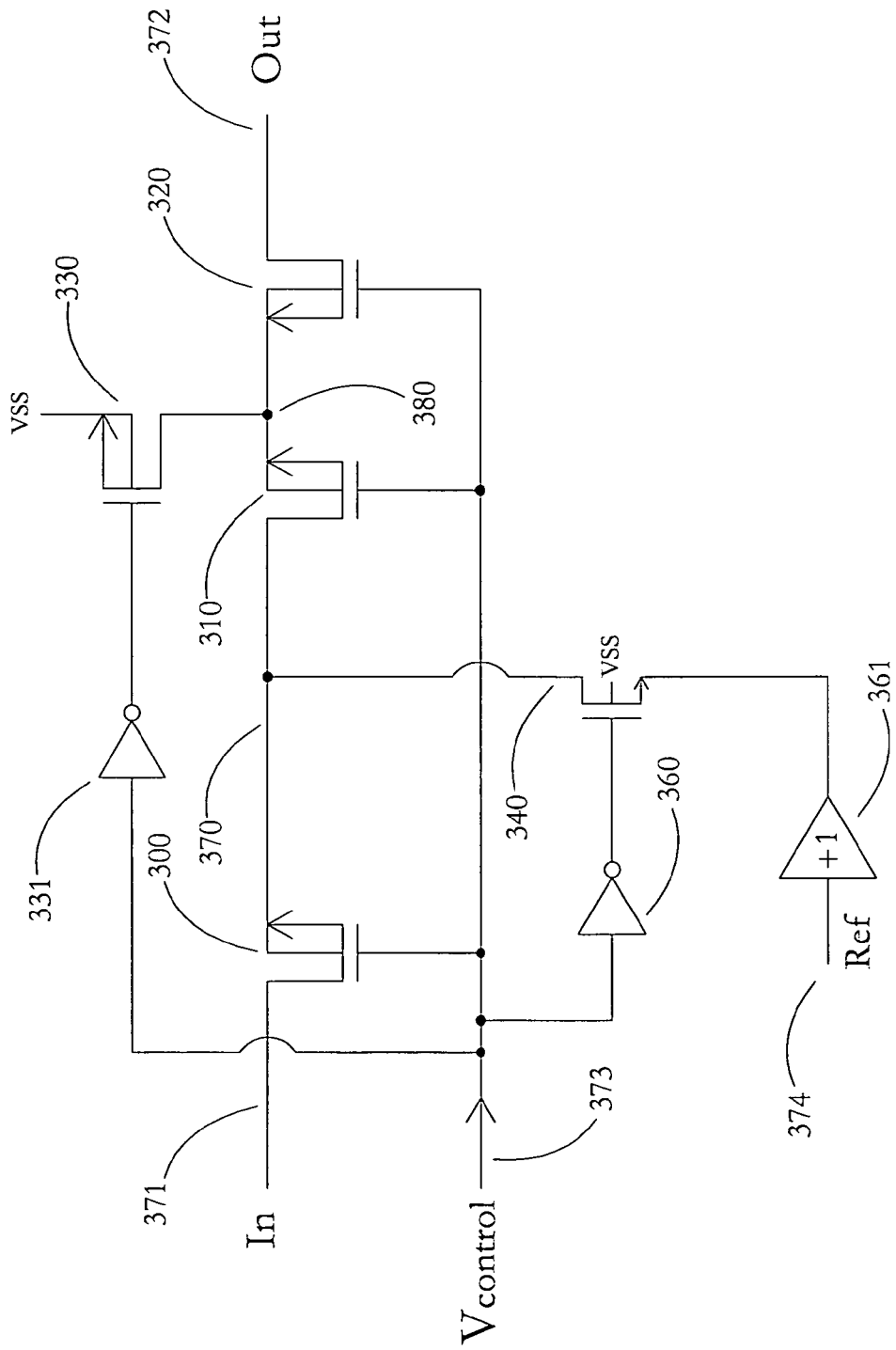
FIG. 3 shows the schematic of a switch using NMOS transistors exhibiting a very high impedance in the "off" state, according to some embodiments of the present invention.

FIG. 3 shows the schematic of a switch having very high impedance in the "off" state, according to some embodiments of the present invention. The switch has an input 371, an output 372, a digital control 373, and another "Ref" input 374 which is connected externally to a signal which voltage is substantially equal to the voltage of the input 371. The switch uses three series NMOS transistors 300, 310, and 320. The drain of 300 is connected to the input 371. The source and the bulk of 300 are connected together to the drain of 310, thus creating the node 370. The source and bulk of 310 are connected together to the source and the bulk of 320, thus creating the node 380. The drain of 320 is connected to the output 372. The control signal sets the voltages of the gates of 300, 310, and 320, to either VDD or VSS, thus turning them on or off. In addition, the unity-gain buffer 361 substantially replicates at its output the voltage of the input "Ref" node 374. In addition, in the "on" mode, the control voltage leaves floating, through the devices 330 and 340, the electrical nodes 370 and 380. In addition, in the "off" mode, the control voltage forces, through the devices 340 and 360, the node 370 to the voltage of the input 374, which is substantially equal to the voltage of the input 371, hence increasing the threshold voltage of the transistor 300 due to its body effect and considerably reducing the leakage current drawn from the input 371. In addition, in the "off" mode, the control voltage forces, through the device 330, the node 380 to VSS. In the embodiments using NMOS transistors, such as shown in FIG. 3, the said NMOS transistors must be implemented in an integrated circuits process which features NMOS transistors with the bulk not connected to the substrate, such as, but not limited to, a "triple-well" process.

Figure 4:
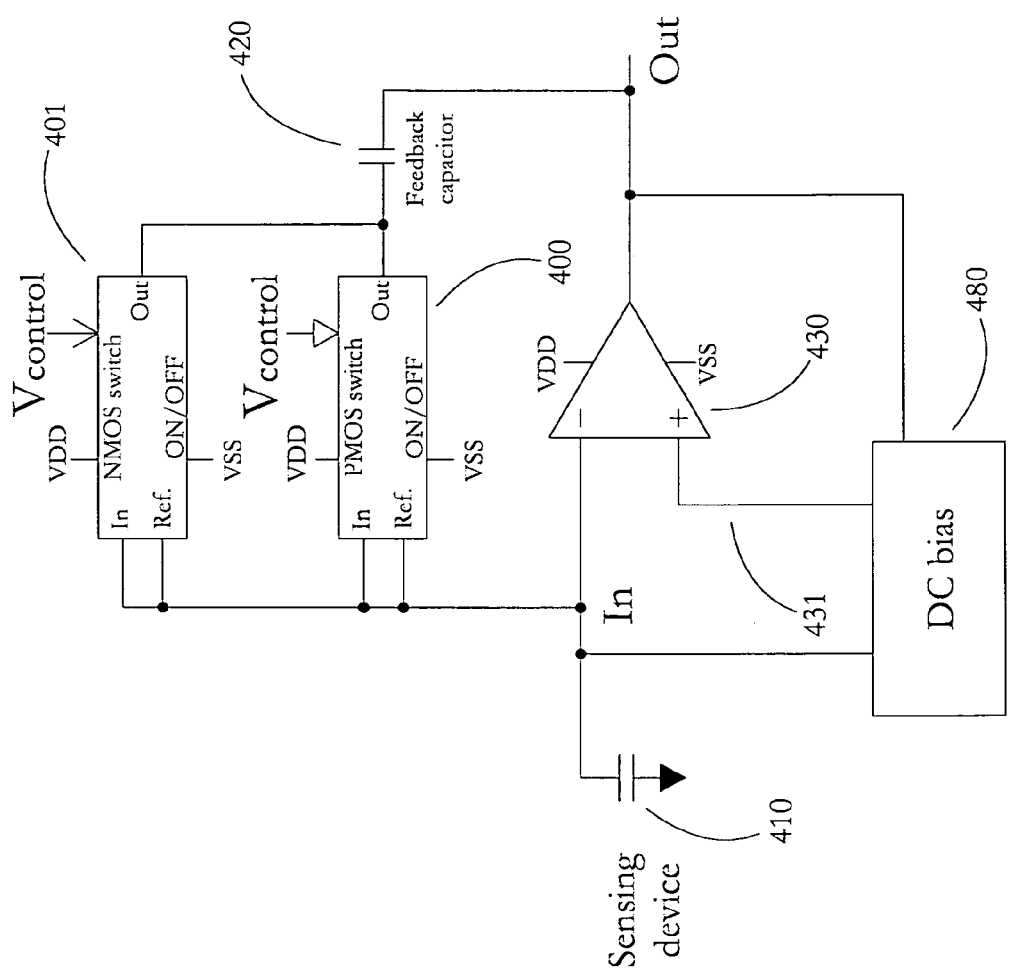
FIG. 4 shows the schematic of a voltage amplifier which amplifies the voltage across a sensing device modeled as a capacitor, and which uses both a switch using PMOS transistors and a switch using NMOS transistors, according to some embodiments of the present invention.

The choice between the embodiment using PMOS transistors (as in FIG. 2) and the embodiment using NMOS transistors (as in FIG. 3) will be made based, among other factors, upon the range of voltages which the sensing devices can generate in relationship to VDD and VSS. This will have a strong impact upon the impedance of the switch in the "on" state. In another embodiment (shown in FIG. 4), when neither an embodiment using PMOS transistors, nor an embodiment using NMOS transistors, provide a low enough impedance in the "on" state for the entire range of voltages across the sensing device, the two switches 400 and 401 can be used in parallel.

It will be clear to one skilled in the art that the above embodiments may be altered in many ways without departing from the scope of the invention. Accordingly, the scope of the invention should be determined by the following claims and their legal equivalents.

What is claimed is:

1. A switch having two states ("on" and "off"), said switch comprising:
    one input;
    one output;
    a digital control signal setting said state of the switch;
    three series MOS transistors (all three being PMOS or all three being NMOS), the drain of the first transistor being connected to said input, the source and the bulk of the first transistor being connected together to the drain of the second transistor, the source and the bulk of the second transistor being connected together to the source and the bulk of the third transistor, the drain of the third transistor being connected to said output, the gates of the three transistors being connected together to said digital control signal; and
    additional circuitry which in the "on" mode leaves floating a node connecting the source of the first transistor and the drain of the second transistor, and a node connecting the source of the second transistor and the source of the third transistor, while in the "off" mode connects the node connecting the source of the first transistor and the drain of the second transistor to a voltage replicating the voltage of the said input, and connects the node connecting the source of the second transistor and the source of the third transistor to a positive power supply (if PMOS transistors are used) or to either ground or a negative power supply (if NMOS transistors are used).

2. The switch from claim 1, wherein the additional circuitry comprises an unity-gain non-inverting amplifier with a very high impedance input, said very high impedance input being connected to said input of the switch.

3. The switch from claim 1, wherein the additional circuitry comprises an unity-gain non-inverting amplifier with a very high impedance input, said very high impedance input being connected to a signal which voltage substantially replicate the voltage of said input of the switch.

4. A method to amplify a voltage across a capacitor, said method comprising:
    an operational amplifier, with its inverting input connected to one of the plates of said capacitor;
    a switch having two states ("on" and "off"), comprising:
        one input;
        one output;
        a digital control signal setting said state of the switch;
        three series MOS transistors (all three being PMOS or all three being NMOS), the drain of the first transistor being connected to said input, the source and the bulk of the first transistor being connected together to the drain of the second transistor, the source and the bulk of the second transistor being connected together to the source and the bulk of the third transistor, the drain of the third transistor being connected to said output, the gates of the three transistors being connected together to said digital control signal; and
        additional circuitry which in the "on" mode leaves floating a node connecting the source of the first transistor and the drain of the second transistor, and a node connecting the source of the second transistor and the source of the third transistor, while in the "off" mode connects the node connecting the source of the first transistor and the drain of the second transistor to a voltage replicating the voltage of the said input, and connects the node connecting the source of the second transistor and the source of the third transistor to a positive power supply (if PMOS transistors are used) or to either ground or a negative power supply (if NMOS transistors are used),
    said switch input being connected to the operational amplifier inverting input;
    a feedback capacitor in series with said switch, one of the feedback capacitor plates being connected to said switch output, and the other feedback capacitor plate being connected to said operational amplifier output.

5. An integrated circuit processing the voltage across a sensing device, said integrated circuit comprising:
   one terminal;
   a switch having two states ("on" and "off"), comprising:
      one input, being connected to said integrated circuit terminal;
      one output;
      a digital control signal setting state of the said switch;
      three series MOS transistors (all three being PMOS or all three being NMOS), the drain of the first transistor being connected to said input, the source and the bulk of the first transistor being connected together to the drain of the second transistor, the source and the bulk of the second transistor being connected together to the source and the bulk of the third transistor, the drain of the third transistor being connected to said output, the gates of the three transistors being connected together to said digital control signal; and
      additional circuitry which in the "on" mode leaves floating a node connecting the source of the first transistor and the drain of the second transistor, and a node connecting the source of the second transistor and the source of the third transistor, while in the "off" mode connects the node connecting the source of the first transistor and the drain of the second transistor to a voltage replicating the voltage of said input, and connects the node connecting the source of the second transistor and the source of the third transistor to a positive power supply (if PMOS transistors are used) or to either ground or a negative power supply (if NMOS transistors are used),
   said switch input being connected to said integrated circuit terminal.

* * * * *